United States Patent [19]
Ono et al.

[11] Patent Number: 5,534,864
[45] Date of Patent: Jul. 9, 1996

[54] PIPELINED ANALOG-TO-DIGITAL CONVERTER

[75] Inventors: Koichi Ono, Kokubunji; Yoshito Nejime, Hachioji; Etsuji Yamamoto, Fussa, all of Japan

[73] Assignees: Hitachi, Ltd.; Hitachi VLSI Engineering Corp., both of Tokyo, Japan

[21] Appl. No.: 12,759

[22] Filed: Feb. 3, 1993

[30] Foreign Application Priority Data

Feb. 3, 1992 [JP] Japan ..................... 4-017453

[51] Int. Cl.⁶ ........................................... H03M 1/14
[52] U.S. Cl. ........................................... 341/156
[58] Field of Search ........................... 341/155, 156, 341/158, 161, 162, 163

[56] References Cited

U.S. PATENT DOCUMENTS

| | | | |
|---|---|---|---|
| 3,691,470 | 9/1972 | Naylor | 307/240 |
| 4,763,107 | 8/1988 | Koen et al. | 341/156 |
| 4,862,171 | 8/1989 | Evans | 341/156 |
| 4,875,038 | 10/1989 | Shimizu et al. | 341/156 |
| 4,893,124 | 1/1990 | Tsuji et al. | 341/156 |
| 5,047,772 | 9/1991 | Ribner | 341/156 |
| 5,210,537 | 5/1993 | Mangelsdorf | 341/156 |
| 5,274,377 | 12/1993 | Matsuura et al. | 341/161 |

OTHER PUBLICATIONS

*A 10 bit 30 MHz Two–Step Parallel A/D Converter*, M. Kanoh, et al. Matsushita Electric Industrial Co., Ltd., Semiconductor Research Center, 1990.

*1990 IEEE International Solid–State Circuits Conference*, "A 10 b 30 MHz Two–Step Parallel BiCMOS ADC with Internal S/H, Session 10: Analog–to–Digital Converters", by A. Matsuzawa, et al. Matsushita Electric Industrial Co., Osaka, Japan; Feb. 1990.

Primary Examiner—Howard L. Williams
Attorney, Agent, or Firm—Antonelli, Terry, Stout & Kraus

[57] ABSTRACT

A pipelined A/D converter which minimizes differential non-linearity by preventing mismatching between converting stages. The A/D converter includes a plurality of converting stages connected in a cascade form wherein each of the converting stages includes an ADC unit for converting an analog input into a digital output. The digital outputs from said converting stages form a conversion output. Each preceding converting stage except a last converting stage further includes an amplifier for deriving and amplifying a conversion residue representing a quantization error resulting from the conversion performed by the preceding converting stage based on the digital output outputted by the ADC unit of the preceding converting stage and the analog input inputted to the preceding converting stage. The amplified conversion residue from the preceding converting stage is supplied as an analog input to a succeeding converting stage. A connector is provided for connecting the amplifier of the preceding converting stage to a node in the ADC unit of the succeeding converting stage. The node provides a base voltage to the ADC unit of the succeeding converting stage.

9 Claims, 9 Drawing Sheets $$Vout = -(Vag + Vin \times Z2/Z1)$$

PIPELINED ANALOG-TO-DIGITAL CONVERTER

BACKGROUND OF THE INVENTION

The present invention relates to an analog to digital (A/D) converter, and in particular, it relates to a pipelined A/D converter that performs analog to digital conversion through the use of conversion blocks divided into a plurality of stages.

A typical A/D converter which performs analog to digital conversion through the use of several numbers of converting blocks is one that performs the two-step parallel method. With reference to FIG. 9, this method is performed by an A/D converter having a (a+b) bit analog to digital converter (ADC) unit composed of two blocks of an upper a-bit ADC and a lower b-bit ADC. More specifically, the A/D converter comprises sample-and-hold circuit (SHC) 1 which holds an analog signal at a constant value during its analog to digital conversion, upper ADC unit 2 which outputs an a-bit digital value, a-bit digital to analog (DAC) unit which converts the a-bit digital value into an analog value, adder 4 which obtains a difference between the analog signal held at SHC 1 and the analog signal derived from the DAC unit 3 and outputs a conversion residue representing a quantization error resulting from the conversion performed by the upper ADC unit 2, amplifier 5 which amplifies the conversion residue output from the adder 4, lower ADC unit 6 which outputs a b-bit digital value, latch circuit 7 which is coupled to ADC unit 2 and ADC unit 6 and outputs a digital signal which includes the a-bit digital value and the 6-bit digital value, and timing controller 8 which controls operation of the above described circuits.

The SHC 1 samples the analog input signal in synchronization with clock timing signals from the timing controller 8 and outputs sample values until lower ADC unit 6 completes its conversion. An output signal from SHC 1 is converted into an a-bit digital value by the upper ADC unit 2. This A/D converted output is again converted into an analog signal by a-bit DAC unit 3, then a difference between the analog signal output by DAC unit 3 and the output signal from the SHC 1 is obtained by adder 4. The difference determined by adder 4 is output as a conversion residue, which is then amplified in amplifier 5. The amplified output from the amplifier 5 is converted into a b-bit digital value by lower b-bit ADC unit 6. Then, the upper and the lower digital values are output as a (a+b) bit output by latch circuit 7. When such an analog to digital conversion operation is performed by dividing the conversion into several steps of sub-blocks, there always arises a problem that any mismatching between analog to digital converting blocks results in differential non-linearity errors. This is mainly caused by the offset voltages of respective analog to digital converting blocks, or dispersions in the gains in the blocks. These offset voltages or dispersions in gain cause a difference between the output voltage range of the amplifier 5 and the input voltage range of the lower ADC unit 6.

A two-step parallel A/D converter described in U.S. Pat. No. 4,875,048 provides a gain correcting circuit for the DAC unit 3 and a reference voltage generating circuit for the lower ADC unit 6. The reference voltage generating circuit adjusts reference voltages for the lower ADC unit 6 on the basis of the step voltage of the output of the DAC unit 3. However, differential non-linearity errors remain when the amplifier 5 have an offset voltage or a mismatched gain.

A co-pending U.S. patent application Ser. No. 907,524 filed on Jul. 2, 1992 describes a pipelined A/D converter provided with digital correction logic for correcting mismatches between a plurality of AD/DA sub-blocks. However, the digital correction logic cannot correct the differential non-linearity errors within a range of ±1 least significant bits (LSB). The conversion characteristics of the converter described in U.S. patent application Ser. No. 907,524 filed on Jul. 2, 1992 can be seen as shown in dotted lines in FIG. 10.

The references "A 10-bit 30 MHz Two-Step Parallel A/D Converter" Japanese Society of Electronics Information & Communications, 1990 Spring National Convention Proceedings, SA-3-1, pp. 1–403,404; and "A 10b 30 MHz Two-Step Parallel Bi-CMOS ADC with Internal S/H" IEEE ISSCC90 pp 162–163, Feb., 1990 describe an A/D converter which employs a technique called "overlapped interpolation method". Such an A/D converter is shown in FIG. 11. This A/D converter is based on the two-step parallel method with upper 6 bits and lower 5 bits. In the A/D converter shown in FIG. 11 in order to correct a matching error between the upper conversion and the lower conversion, the lowermost bit of the upper 6 bits and the uppermost bit of the lower 5 bits are overlapped, thereby providing a 10 bit output. The lower conversion is carried out after dividing the range of the reference voltage which has been specified by the upper conversion into 32 equal partitions, then amplified. Thus, operating errors in the lower comparator become the reciprocal of a gain, thereby substantially reducing errors occurring in the lower conversion. Further, because a reference voltage to be used in the lower conversion is generated on the basis of a reference voltage being used in the upper conversion, an A/D converter having a small differential non-linearity error is capable of being realized.

Although the above conventional technique is very convenient for obtaining a small differential non-linearity error without adjustment, it has the following disadvantages.

Whereas the lower conversion is performed following the upper conversion, the analog input signal must be held at a 10 bit precision during the whole period of time of such conversion. Thus, a fast, high precision SHC is required.

Further, differential amplifiers which produce a reference voltage for the lower conversion are needed in as many numbers as required corresponding to the upper resolution desired. Also, gains of the differential amplifiers must be strictly controlled.

Therefore, because of the above described disadvantages the circuit configuration of the A/D converter becomes complicated, and the circuit scale accordingly expands, resulting in an increased chip area and increased power consumption.

SUMMARY OF THE INVENTION

In view of the above stated circumstances, An object of the invention is to provide a pipelined A/D converter which minimizes differential non-linearity errors with a simple circuit structure.

Another object of the invention is to provide a pipelined A/D converter in which the number of amplifiers affecting differential non-linearity errors is reduced.

A further object of the invention is to provide an A/D converter which has a circuit structure that provides small differential non-linearity errors with minimal increase in power dissipation and chip area.

A pipelined A/D converter according to the invention has a plurality of converting stages connected in cascade form. Each converting stage determines a portion of the bits of the final conversion output. Each of the converting stages, except the last converting stage, includes a low resolution ADC unit for converting an analog input into a digital output, a DAC unit for converting the output of the low resolution ADC unit into an analog signal and a chopper amplifier for deriving and amplifying a difference between the analog input and the analog signal output by the DAC unit. The chopper amplifier outputs an amplified conversion residue representing a quantization error resulting from the conversion performed by the converting stage. The conversion residue is applied to a succeeding converting stage as its analog input.

In present invention the chopper amplifier is provided in association with a reference voltage generator in the low-resolution ADC unit of the succeeding converting stage. The chopper amplifier derives a relative voltage level on the basis of a base voltage used during the analog to digital conversion that occurred in the succeeding converting stage. The chopper amplifier includes an operational amplifier having an inverting and noninverting input terminals, a feedback capacitor connected between an output terminal of the operational amplifier and the inverting input terminal of the operational amplifier, a sampling capacitor connected to the inverting input terminal, and a chopper for sequentially supplying the analog input and the output of the DAC unit to the other end of the sampling capacitor.

Also provided in the present invention is a connector for electrically connecting a node in the reference voltage generator of the succeeding converter stage, wherein the node has applied thereto the base voltage of the reference voltage generator in the succeeding converting stage, and the noninverting input terminal of the operational amplifier. The connector supplies the base voltage of the reference voltage generator in the succeeding converting stage from the node to the non-inverting input terminal. The base voltage is a voltage corresponding to one end voltage of the full scale range of the analog to digital conversion which occurred in the succeeding converting stage, (i.e. a reference voltage corresponding to a conversion output of all zero in the succeeding converting stage).

When an operational amplifier as shown in FIG. 12 is utilized as a feedback amplifier, it is generally known that amplified signals are output relative to a voltage level being applied to a noninverting input. Therefore, according to the circuit structure of the present invention described above, the base voltage of the amplified conversion residue outputted from the chopper amplifier of a preceding converting stage is automatically coincident to the base voltage of the succeeding converting stage. Consequently, in the present invention differential non-linearity errors due to offset voltage between conversion stages is minimized. There is no need for adding a new circuit in the succeeding converting stage for generating the base voltage because it is generated as one of the reference voltages for the analog to digital conversion in the succeeding converting stage. Thus, in the present invention increases in the circuit area and power dissipation are prevented, thereby realizing a low power consumption A/D converter.

BRIEF DESCRIPTION OF THE DRAWINGS

The invention will be fully comprehended from the following detailed description of the preferred embodiments taken in connection with the following drawing in which.

DESCRIPTION OF THE PREFERRED EMBODIMENTS

Figure 1:
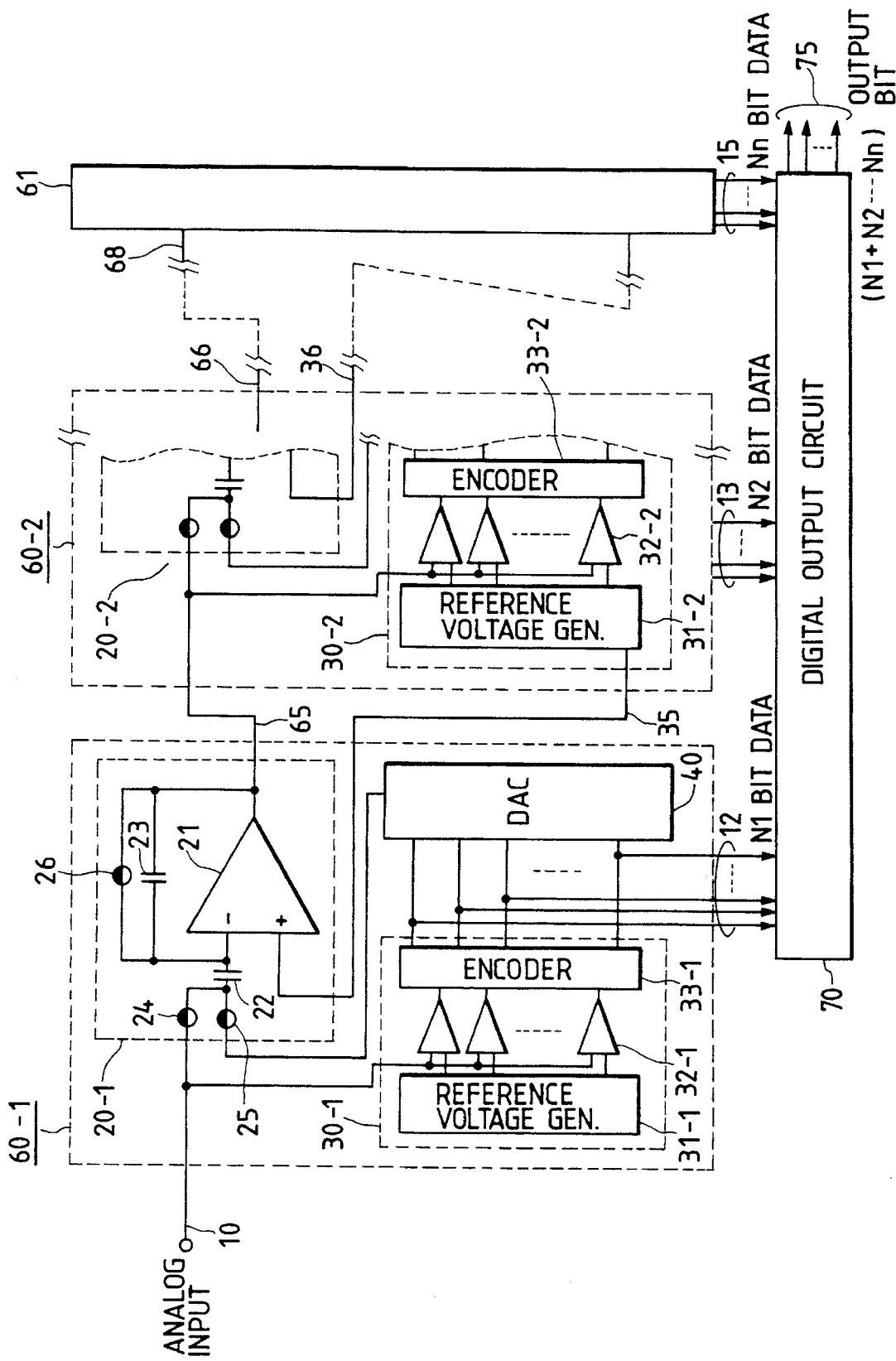
FIG. 1 is a schematic block diagram showing one embodiment of the invention.

FIG. 1 is a block diagram showing an A/D converter of a first embodiment of the invention. The A/D converter shown in FIG. 1 has several converting stages 60-1, 60-2, ..., and 61. Analog input 10 to be converted is applied to the first converting stage 60-1 which determines output data 12 of N1 bits. Output data 12 of N1 bits are the most significant bits of a final digital output 75. The first converting stage 60-1 also derives an amplified conversion residue 65 representing a quantization error resulting from the conversion performed by the first converting stage 60-1. The amplified conversion residue 65 is derived based on the output data 12 and the analog input 10. The amplified conversion residue 65 is supplied to the second converting stage 60-2 as an analog input.

The second converting stage 60-2 determines output data 13 of N2 bits from the amplified conversion residue 65. The output data 13 of N2 bits is the next significant bits of the digital output 75. The second converting stage 60-2 also derives an amplified conversion residue 66 representing a quantization error resulting from the conversion performed by the second converting stage 60-2 same as the first converting stage 60-1. The conversion residue 66 is supplied to the succeeding converting stage.

Thus, each converting stage determines a portion of the bits of the digital output 75 based on a conversion input, derives an amplified conversion residue representing a quantization error and supplies the conversion residue to a succeeding converting stage as an analog input. The last converting stage 61 determines output data 15 of Nn bits indicating the least significant bits of the digital output 75 from an amplified conversion residue 68 supplied from a preceding converting stage.

All of the output data 12, 13 and 15 are supplied to a digital output circuit 70. The digital output circuit 70 latches the output data 12, 13 and 15 and outputs the final digital output 75 having a total bits of (N1+N2+ ... +Nn).

Each of the converting stages is provided with an ADC unit which is a flash type A/D converter. Thus, the first converting stage 60-1 is provided with a N1 bit ADC unit 30-1 composed of a reference voltage generator 31-1, comparators 32-1, and an encoder 33-1. The comparators 32-1 sample a value of the analog input at the same time and each comparator compares the value sampled thereby to one of a plurality of reference voltages supplied from the reference voltage generator 31-1. When the comparisons are performed a thermometer code signal appears at the output terminals of the comparators 32-1. The thermometer code signal is encoded into a binary code signal composed of N1 bits by the encoder 33-1. Each of the ADC units in the other converting stages has a similar structure.

Each of the converting stages 60, except the last conversion stage 61, has a circuit to obtain the amplified conversion residue. Specifically, the digital output from the ADC unit 30-1 is re-converted into an analog signal by a DAC unit 40. The difference between analog input 10 and the analog signal output by the DAC unit 40 is derived and amplified by a chopper amplifier 20-1. The chopper amplifier 20-1 includes an operational amplifier 21. A sampling capacitor 22 having capacitance of Cs is connected to an inverting input terminal of the operational amplifier 21. A feedback capacitor 23 having capacitance of Cf is connected between the output terminal of the operational amplifier 21 and the inverting input terminal of the operational amplifier 21. A switch 24 is provided such that the switch 24 is connected between the sampling capacitor 22 and the conversion input 10. A switch 25 is provided such that the switch 25 is connected between sampling capacitor 22 and the DAC unit 40. A switch 26 is provided and connected between the output and inverting terminals of the operational amplifier 21. The switches 24, 25 and 26 can be implemented by CMOS switches.

The basic operation of the chopper amplifier 20-1 is as follows. At first, the switch 26 is short-circuited to discharge the feedback capacitor 23, and the switch 24 is also short-circuited so that the charge of sampling capacitor 22 follows the conversion input 10. Then, the switch 24 is opened at the same time as when the comparators 32-1 sample the conversion input 10. Namely, the value of the analog input 10 to be converted is sampled by both the comparators 32-1 and the chopper amplifier 20-1. Both of the switches 24 and 25 are opened when the comparators 32-1 are in a comparing mode and the DAC unit 40 determines its output. After the output of the DAC unit 40 is determined, the switch 26 is turned off, and the switch 25 is turned on. At this time, the operational amplifier 21 charges the feedback capacitor 23 so as not to cause a voltage change at the inverting terminal. Therefore, a voltage of Cs/Cf times the difference between the analog input 10 and the output of the DAC unit 40 appears at the output terminal of the chopper amplifier 20-1. Thus an amplified conversion residue 65 is obtained and is supplied to the second converting stage 60-2 as its analog input to be converted.

Figure 2:
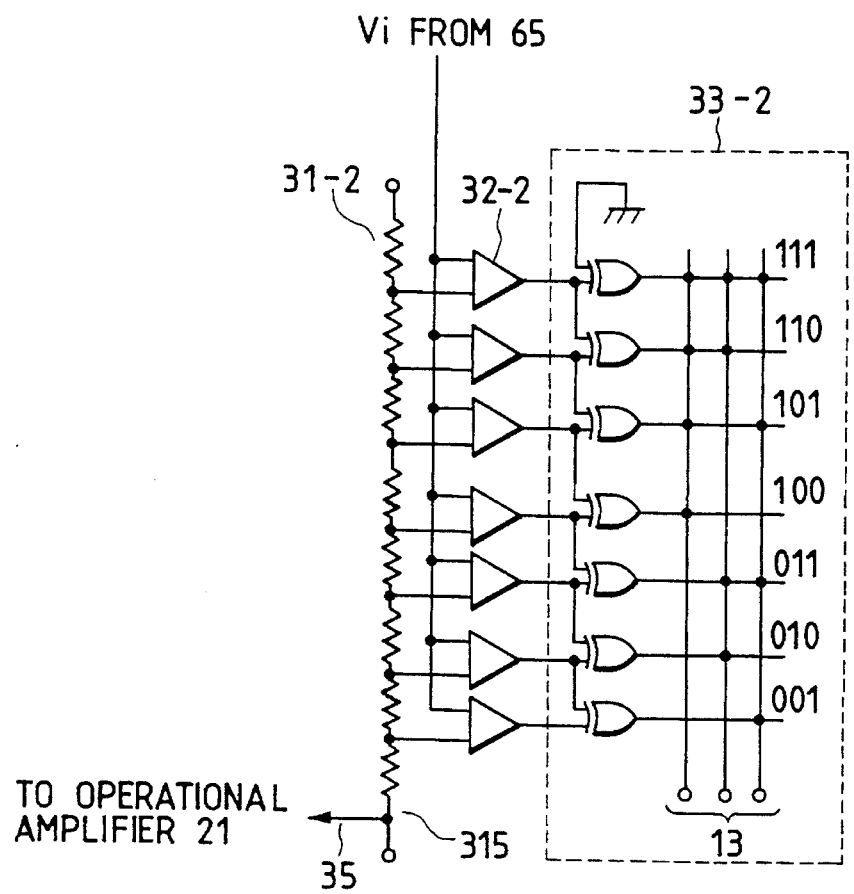
FIG. 2 is a circuit diagram showing a reference voltage generator in the embodiment.

In the above arrangement, in order to prevent a conversion error due to mismatching between conversion stages, the noninverting input of the operation amplifier 21 is connected to a node 315 in the reference voltage generator 31-2 of the ADC unit 30-2 in the second converting stage 60-2 by a connecting line 35. The node 315 to which the connecting line 35 is connected is shown in FIG. 2. If the ADC unit 30-2 is a 3-bit flash type A/D converter, the reference voltage generator 31-2 has a series of eight resistors which divide the full scale voltage range of the ADC unit into eight levels. The node 315 has applied thereto a base voltage to be used during the conversion performed by the ADC unit 30-2. Therefore, the base voltage, which is one end voltage of the full scale range of the ADC unit 30-2 corresponding to all zero output, is supplied to the noninverting input terminal of the operational amplifier 21 of the first converting stage as shown in FIG. 1.

A chopper amplifier 20-2 in the second converting stage, which is partly shown in FIG. 1, has a similar circuit structure as the chopper amplifier 20-1 of the first converting stage. Namely, a connecting line 36 connects a node in a reference voltage generator (not shown) of a succeeding converting stage, at which a base voltage used the succeeding converting stage (not shown) is applied, and the noninverting input terminal of an operational amplifier (not shown) in the chopper amplifier 20-2.

Figure 3:
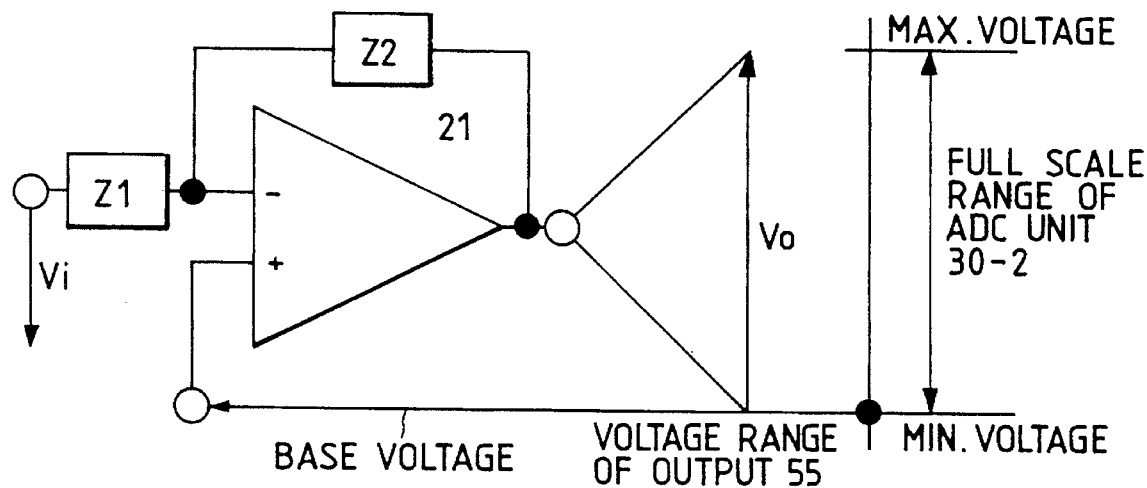
FIG. 3 is a schematic diagram illustrating the principle of operation of the invention.

According to the circuit arrangement, the base voltage used to obtain the conversion residue 65 is the same voltage as the base voltage used during the conversion performed by the ADC unit 30-2. In other words, the chopper amplifier 20-1 derives an amplified conversion residue 65 having a relative voltage level based on the base voltage used in the ADC unit 30-2. Accordingly, if the amplification factor of the chopper amplifier 20-1 is properly designed, the output voltage range of the chopper amplifier 20-1 is perfectly coincident to the full scale voltage range of the ADC unit 32-2 in the succeeding conversion stage as shown in FIG. 3. Thus, mismatching between the first converting stage 60-1 and the second converting stage is prevented, as well as, mismatchings between succeeding converting stages.

Figure 4:
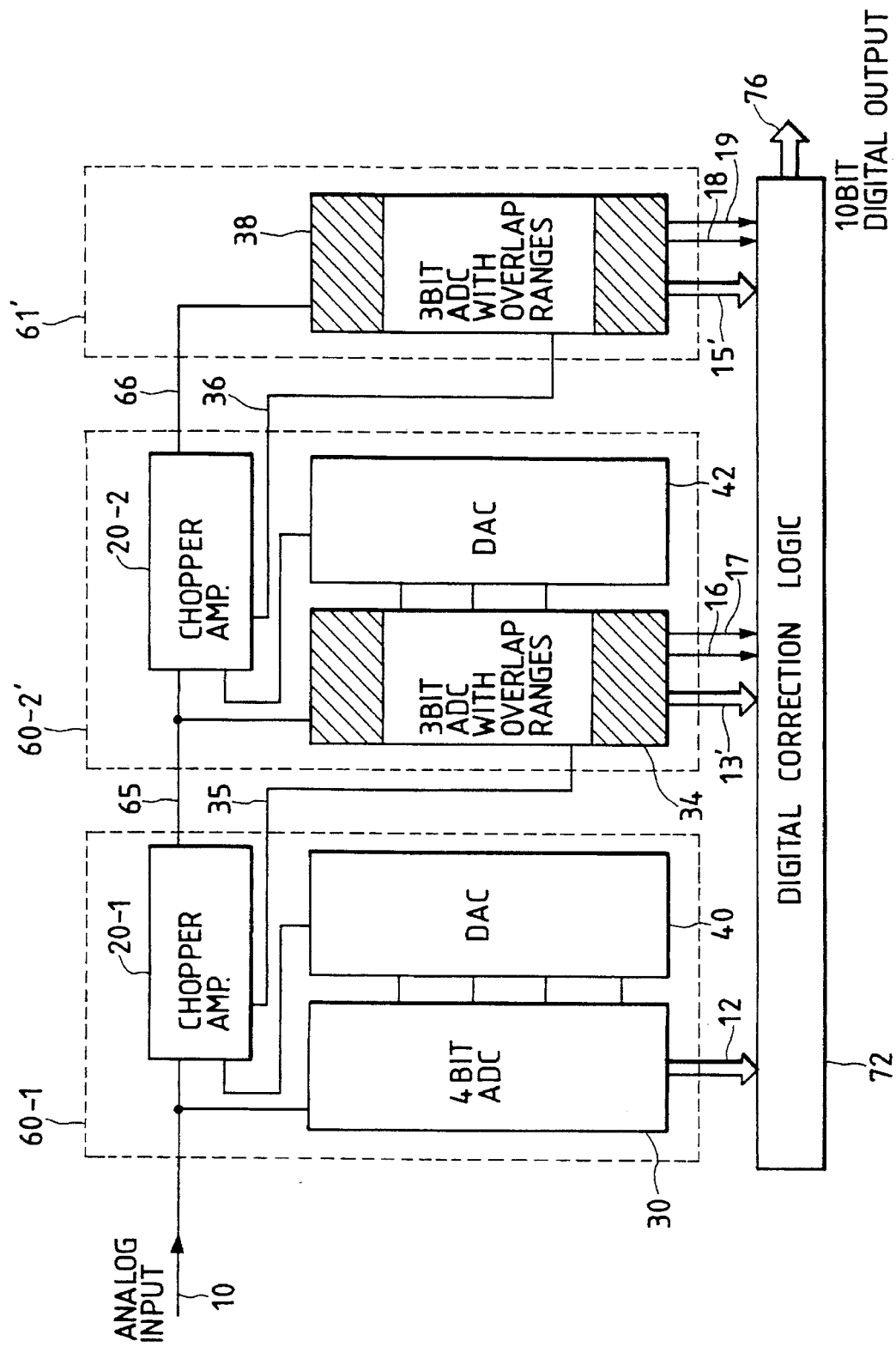
FIG. 4 is a schematic block diagram showing another embodiment of the invention.

FIG. 4 shows another embodiment of the invention. The A/D converter shown in FIG. 4 have three converting stages 60-1, 60-2', and 61', respectively determining portions of a final output 76 of 4 bits, 3 bits and 3 bits. Accordingly, the final output 76 of the A/D converter has a resolution of 10 bits. The first converting stage 60-1 has a same structure as the aforementioned embodiment shown in FIG. 1. Namely, the base voltage used by the succeeding converting stage 60-2' is supplied to the chopper amplifier 20-1 via connecting line 35. The chopper amplifier 20-1 derives a conversion residue 65.

Figure 5:
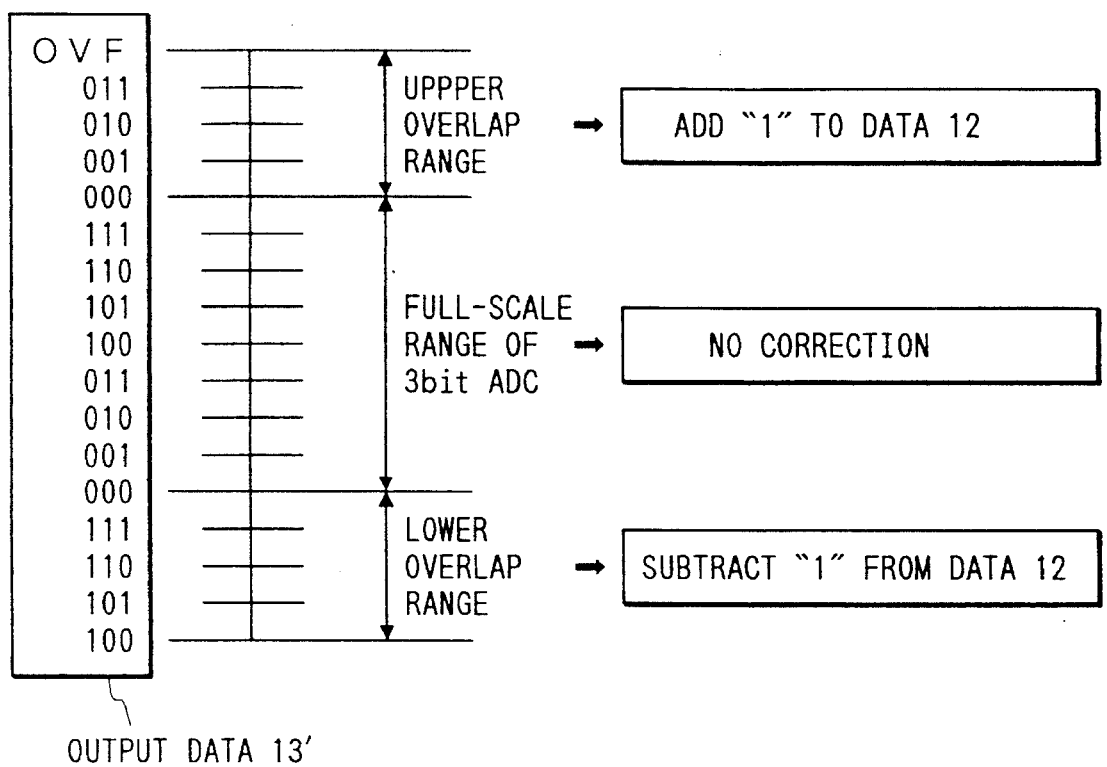
FIG. 5 is a diagrammatical illustration of overlap ranges of the embodiment of FIG. 4.

The ADC unit 4 formed in the second converting stage 60-2' is not a simple 3-bit A/D converter but a flash type 3-bit A/D converter having additional conversion ranges each allocated at the upper side and lower side of a normal full-scale range of a 3-bit A/D converter as shown in FIG. 5. These additional conversion ranges are respectively called upper overlap range and lower overlap range. If the conversion performed by the ADC unit 34 of the succeeding converting stage results in output data 13' being in the upper overlap range, the output data 12 from the preceding converting stage 60-1 should be corrected by adding "1" thereto. If the conversion performed by the ADC unit 34 of the succeeding connecting stages results in output data 13' being in the lower overlap range, the output data 12 of the preceding connecting stage should be corrected by subtracting "1" therefrom. Output signals 16 and 17 from the ADC unit 34 shown in FIG. 4 are correction signals for causing the corrections described above.

The conversion result thus obtained in the ADC unit 34 is converted back to an analog signal by DAC unit 42, and the analog signal is supplied to chopper amplifier 20-2 to obtain an amplified conversion residue 66. Again, the base voltage used by the succeeding converting stage 61' is supplied to the chopper amplifier 20-2 by connecting line 36 to prevent mismatching between these stages. The ADC unit 38 formed in the third converting stage 61' is also an A/D converter with upper and lower overlap ranges. Accordingly, the outputs from ADC unit 38 include 3-bit output data 15', and correction signals 18 and 19 for causing the correction of the 3-bit output data 13' of the preceding connecting stage.

The output data 12, 13' and 15', as well as correction signals 16, 17, 18, 19 are supplied to a digital correction logic 72 which outputs a final conversion output 76 of 10 bits based on output data 12, 13' and 15' and correction signals 16, 17, 18, and 19. The digital correction performed by the digital correction logic 72 is described in more detail in co-pending U.S. patent application, Ser. No. 907,524, filed on Jul. 2, 1992.

Figure 6:
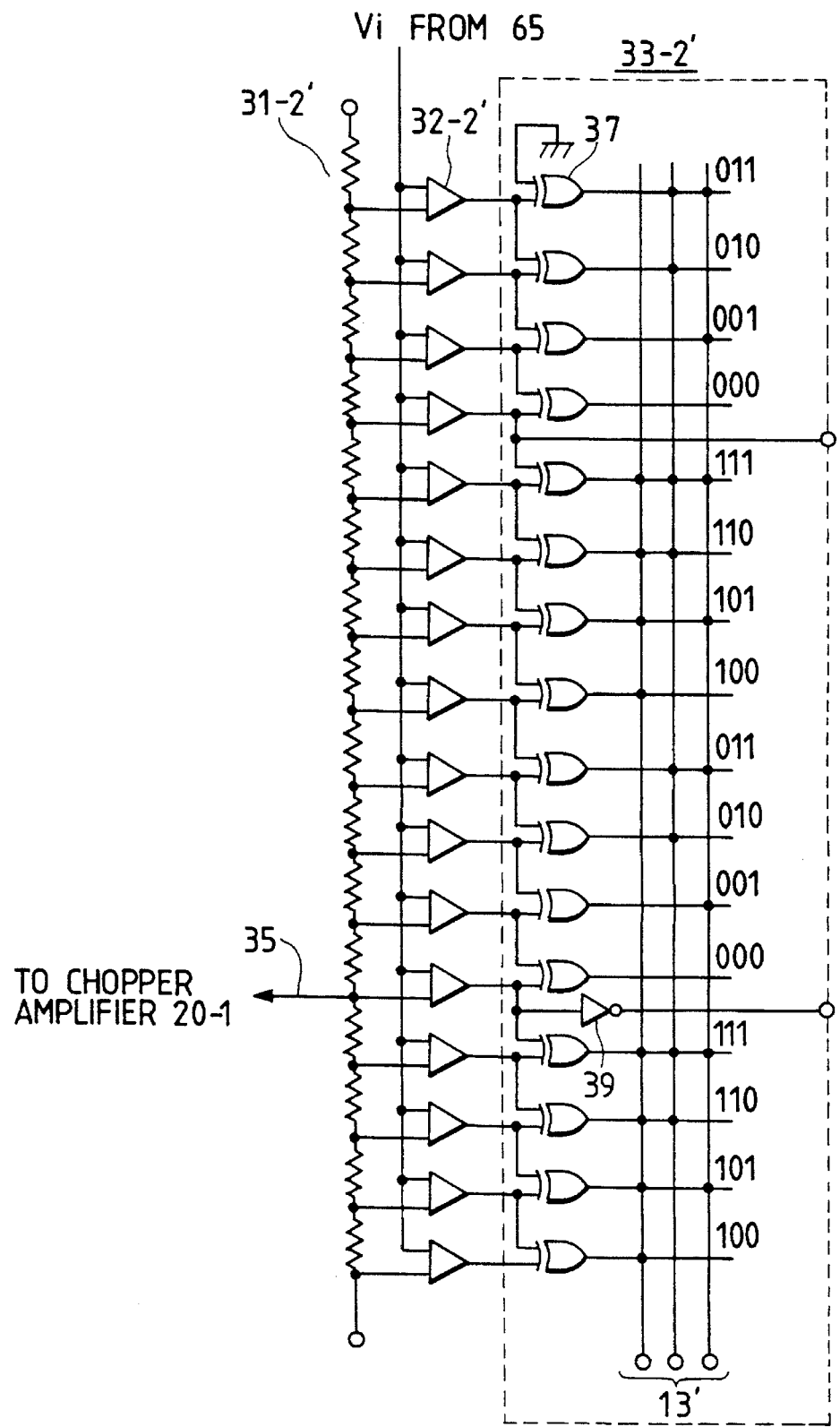
FIG. 6 is a circuit diagram showing a reference voltage generator in the embodiment in FIG. 4.

FIG. 6 is a circuit diagram of the ADC unit 34 with overlap ranges. Each of the upper overlap range and the lower overlap range has a range equal to four times the LSB of the ADC unit 34. Accordingly, a reference voltage generator 31-2' include a resistor ladder formed with sixteen resistors, and taps of the resistor ladder supply sixteen-reference levels respectively. The comparators 32-2' respectively compare the analog conversion input Vi to the respective reference levels supplied by the resistor ladder. The encoder 33-2' has sixteen exclusive-OR gates 37 which convert a thermometer code signal supplied by comparators 32-2' into a one-of-16 signal thereby causing the encoder 33-2' to supply 3-bit output data 13'. The correction signal 16 which indicates that the analog input is in the upper overlap range is obtained from the output terminal of the fourth comparator from the top of the comparator array. The correction signal 17 which indicates that analog input Vi is in the lower overlap range is obtained from an inverter 39 which is connected to the output terminal of the fifth comparator from the bottom of the comparator array.

Connecting line 35 which is connected to the chopper amplifier 20-1 in the first converting stage 60-1 is connected not to an end of the resistor ladder but to a node of the resistor ladder which supplies a reference level corresponding to the output of all zeros. Namely, a voltage corresponding to one end voltage of the full-scale range except the overlap ranges of the ADC unit is supplied to the chopper amplifier 20-1 as a base voltage. The circuit structure of the ADC unit 38 is the same as the ADC unit 34.

According to the above described structure with the digital correction logic 72, differential non-linearity error is minimized even when the gains of chopper amplifiers 20-1 and 20-2 are not exactly correct.

Figure 7:
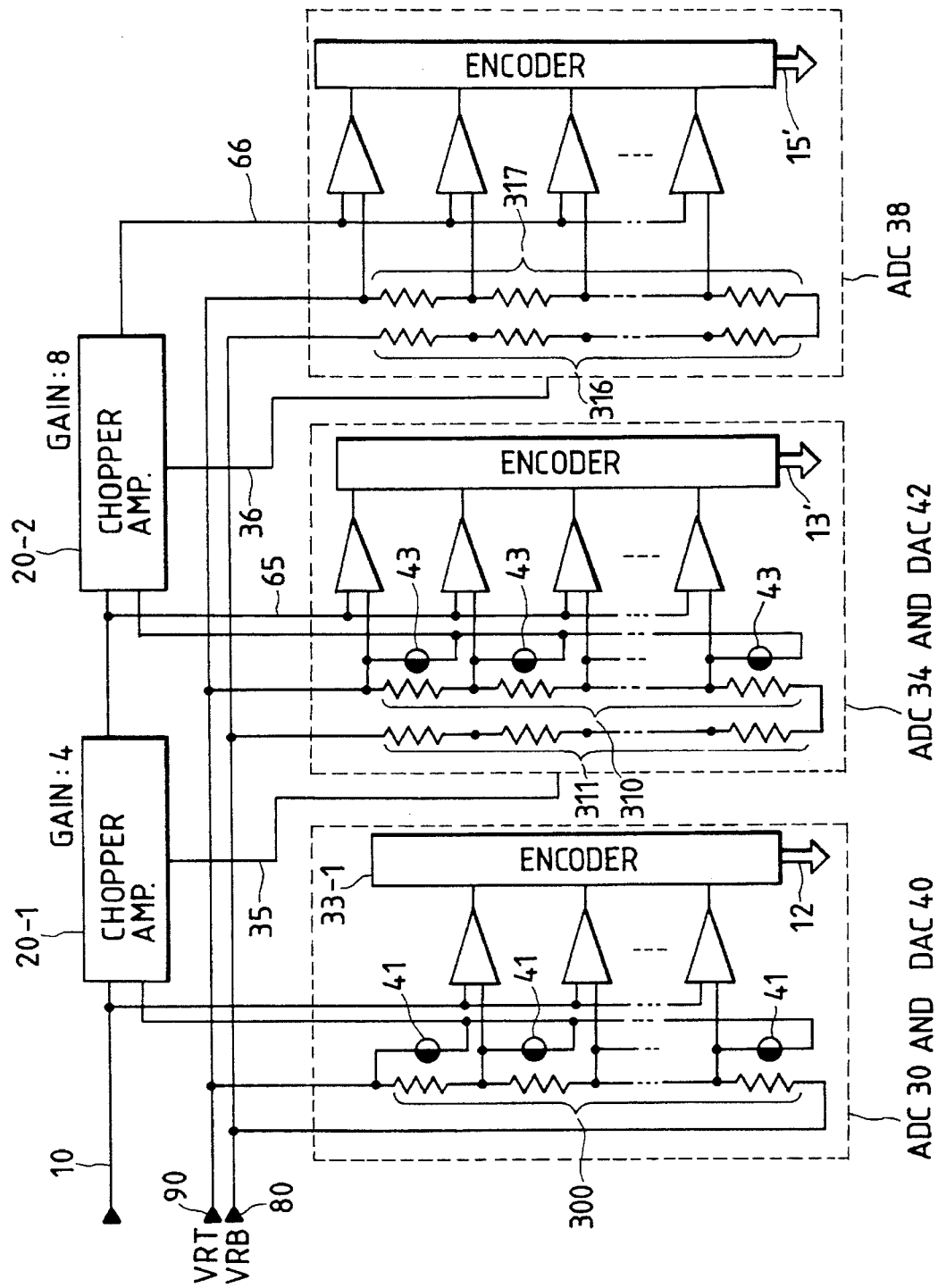
FIG. 7 is a schematic block diagram illustrating the example of FIG. 4 in further detail.

The A/D converter shown in FIG. 4 have a special structure to provide a high-speed, high resolution conversion without increasing the number of voltage supplies. The structure is illustrated in FIG. 7. Namely, the DAC unit 40 in the first converting stage 60-1 is formed with a plurality of switches 41. The reference voltage generator in the DAC unit 30 has a resistor ladder 300 formed with sixteen serially connected resistors and the switches 41 are respectively connected to taps of the resistor ladder 300. The taps supply sixteen reference levels of the ADC unit 30. The switches 41 are respectively controlled by exclusive-OR gates in the encoder 33-1 which derive a one-of-16 signal determining digital output 12. Accordingly, one of the switches 41 is selectively turned ON, and one of the reference levels which corresponds to the digital output 12, is selected as the output of the DAC unit 40. The DAC unit 42 in the second converting stage is formed with a plurality of switches 43 respectively controlled by exclusive-OR gates 37 in the encoder 33-2', which are shown in FIG. 6

The gain of the amplifier which derives and amplifies the conversion residue in the pipelined A/D converters of the disclosed type is generally selected as $2^N$ if the ADC unit in a preceding converting stage has a resolution of N bits. Further, if the ADC unit in the succeeding converting stage is an ADC unit with overlap conversion ranges, the gain is generally selected as $2^{(N-1)}$. These selections provide the condition that supply voltages to both ends of the resistor ladder in the preceding converting stages are coincident to those to both ends of the resistor ladder in the succeeding converting stages. This condition is desirable especially when the pipelined A/D converter is formed in an IC, because the number of supply voltages from the outside of the IC does not increase.

Based on the above, the gain of the chopper amplifier 20-1 in FIG. 4 should be 8, because ADC unit 30 is a 4-bit ADC unit and ADC unit 34 has overlap ranges. Also, the gain of the chopper amplifier 20-2 should be 8, because ADC unit 34 is a 3-bit ADC unit. In this embodiment, however, the gain of the chopper amplifier 20-1 is selected to 4, (i.e. a half of a calculated gain) and the gain of the chopper amplifier 20-2 is selected to 8 (i.e. the calculated gain) as shown in FIG. 7.

In connection with the selection of the gains, the resistor ladder 310 in the ADC unit 34, which includes sixteen resistors is connected to an additional resistor ladder 311 which also includes sixteen resistors. Also, a resistor ladder 317 in the ADC unit 38 which includes sixteen resistors is connected to another additional resistor ladder 316. According to this structure, common supply voltages 80 and 90 can be applied to both ends of resistor ladder 300 in ADC unit 30, to both ends of serially connected resistor ladders 310 and 311 and to both ends of serial connected resistor ladders 316 and 317. Accordingly, a pair of voltage supply terminals 80 and 90 is provided and connected commonly to the all converting stages.

The reason why the gain of the chopper amplifier 20-1 in the first converting stage 60-1 is reduced from the calculated value is that the amplifier in the first converting stage is specially required to have a high operation speed and high stability and that it is difficult to obtain an amplifier that provides high gain, high operation speed and high stability at the same time. If two sets of additional resistor ladders are prepared and serially connected in each of ADC unit 34 and ADC unit 38, the gain of chopper amplifier 20-1 can be further reduced to $2^{(N-1)}/3$.

Thus, the gain of the amplifier in the first converting stage can be reduced to $2^{(N-1)}/m$ (when overlap ranges are employed) or $2N/m$ (without overlap ranges, where m=2, 3, 4, ...) and is neither the number of bits nor the number of conversion stages. While, the gains of amplifiers in the second and further succeeding converting stages should always be calculated values which can be expressed as $2^{N2}$, $2^{N3}$, ... (where N2, N3, ... are output bit numbers of the second and further succeeding converting stages). The variable m is a user selectable value for obtaining reduced gain in the amplifier of the first converting stage relative to the amplifiers of the succeeding stages. As described above it is desired that the gain in the amplifier of the first converting stage be reduced relative to the gains in the amplifiers of the succeeding stages. This reduction may be by a factor of 2, 3 or 4 ... etc. The reference levels in the second and further succeeding converting stage are spread in a range corresponding to 1/m of the full-scale range of the first converting range in the structure. However, common supply voltage can be employed to all of converting stages by employing (m−1) sets of additional resistor ladders in each of the second and further succeeding converting stages.

In the embodiment shown in FIGS. 4–7, the voltage difference between the supply voltages 80 and 90 is selected to be 1 volt. The precision required for the chopping amplifier 20-1, in other words the allowable error in the output of the chopper amplifier 20-1 at the time of sampling at the second converting stage 60-2', is ±2 mV. Whereas, the precision required for the chopper amplifier 20-2 is ±15 mv. The precision required for resistor ladders 310 and 311, or 316 and 317 can be easily satisfied because the additional resistor ladder 311 or 316 is formed with resistors having the same structure and the same resistance value of resistors in the original resistor ladder 310 or 317.

Figure 8:
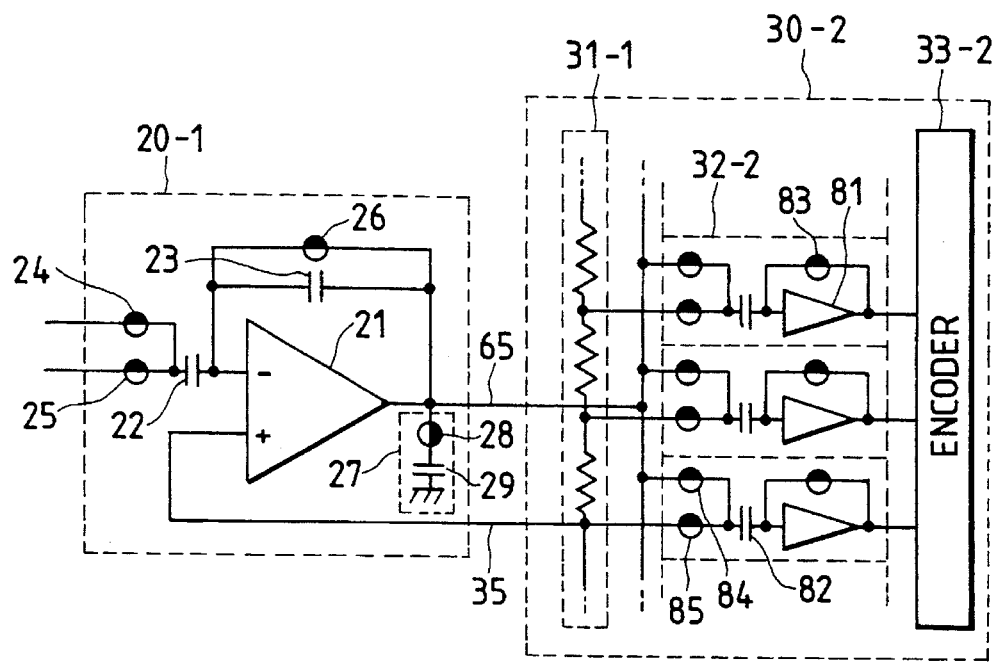
FIG. 8 is a schematic block diagram showing a further embodiment of the invention.
Figure 9:
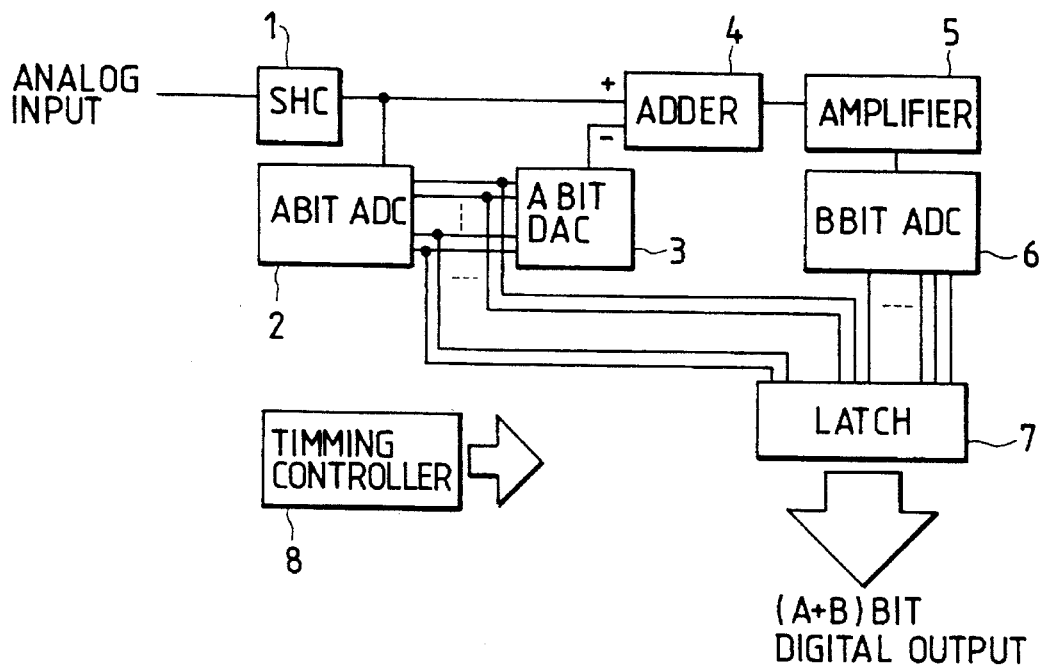
FIG. 9 is a schematic block diagram showing a two-step parallel A/D converter of the prior art.
Figure 10:
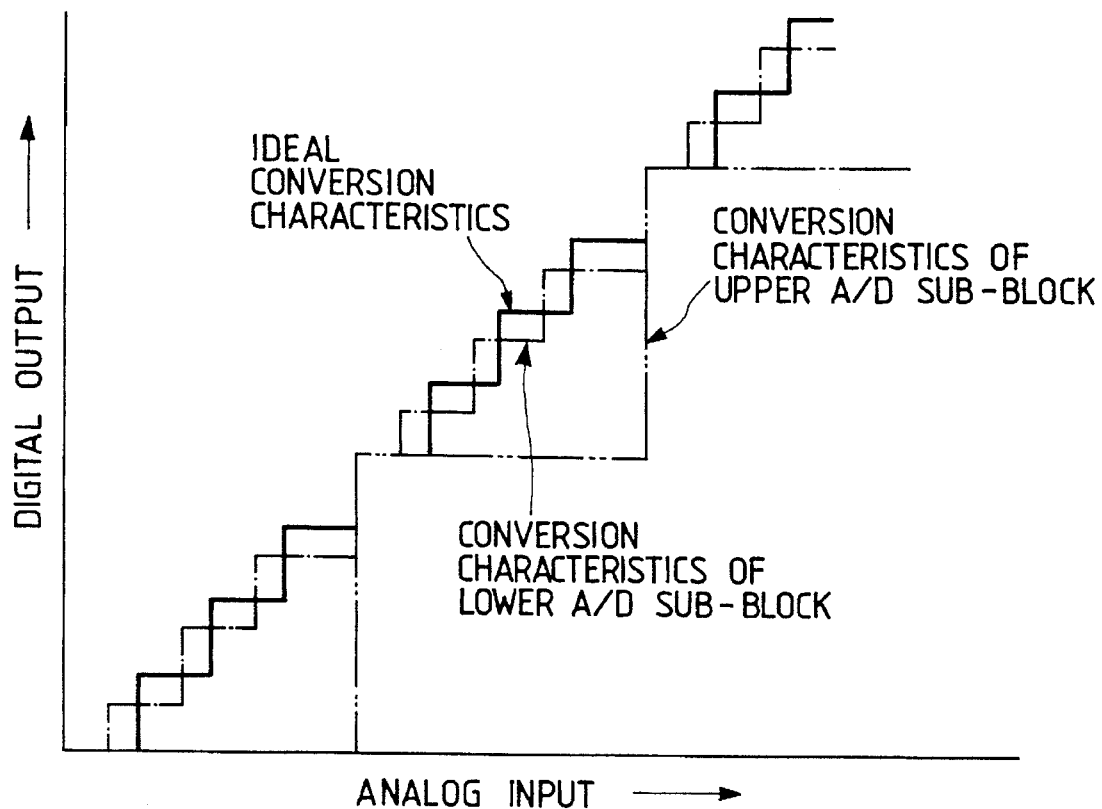
FIG. 10 is conversion characteristics where mismatching occurred in the upper and lower converting stages.
Figure 12:
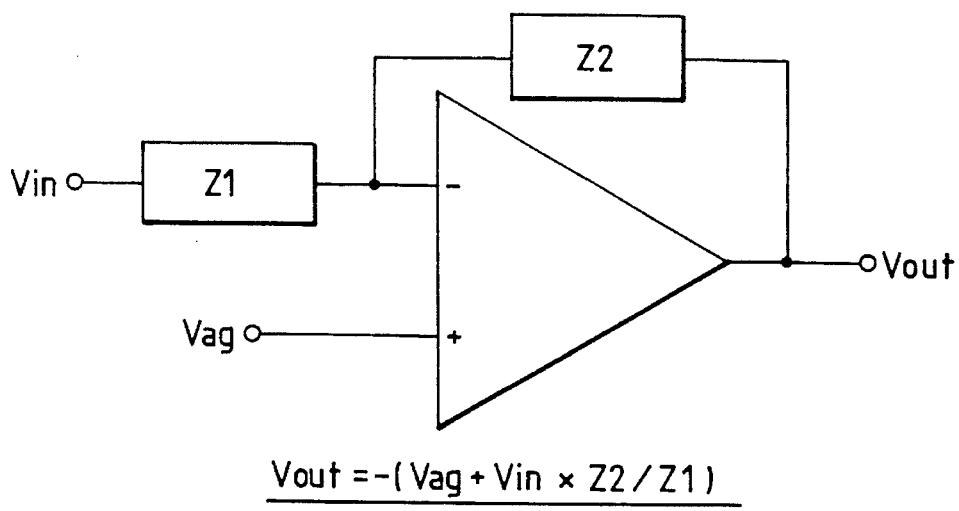
FIG. 12 is a block diagram showing the basic operation of an operational amplifier.
Figure 11:
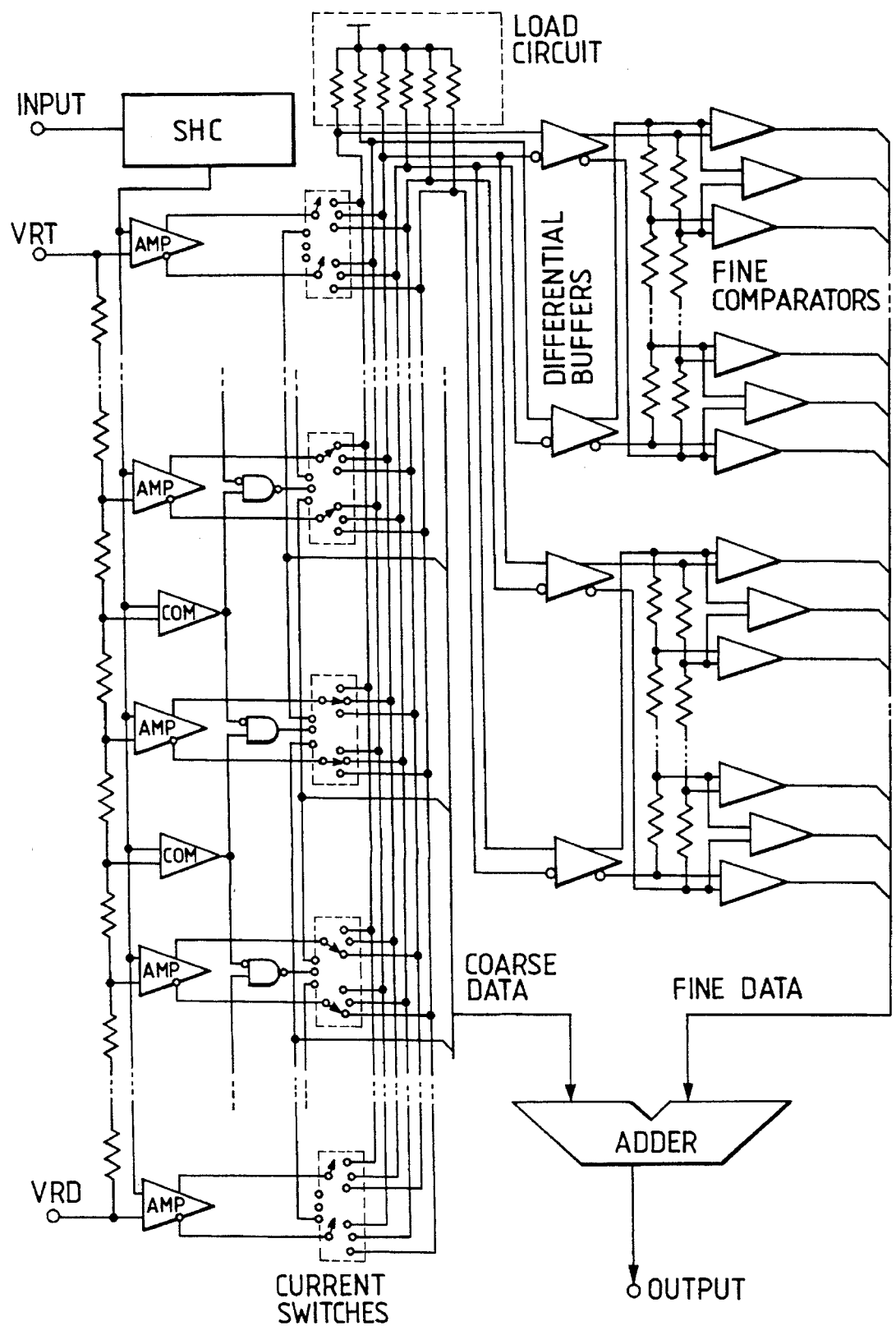
FIG. 11 is a schematic block diagram of another two-step parallel ADC of the prior art.

FIG. 8 shows another embodiment of the invention. According to the structure shown in FIG. 1, the comparators 32-1 and 32-2 have a signal sampling function. When inverter chopper type comparators shown in FIG. 8 are employed as comparators 32-2 in the ADC unit 30-2 in the second converting stage, the chopper amplifier 20-1 suffers from load change. Each of the comparators 32-2 in FIG. 8 includes an inverter amplifier 81, a sampling capacitor 82 connected to an input terminal of the inverter amplifier 81, a switch 83 inserted in a feedback loop of the inverter amplifier 81 and switches 84 and 85 which apply the output 65 from chopper amplifier 20-1 and a reference level generated by the reference voltage generator 31-2 sequentially to the inverter amplifier 81.

In the sample mode, the sampling capacitor 82 is loaded to the chopper amplifier 20-1 because switches 83 and 84 are ON. In the hold mode (comparing mode) the sampling capacitor 82 is not loaded to chopper amplifier 20-1 because switches 83 and 84 are OFF. Thus mode transitions in the comparators 32-2 cause a load change for the chopper amplifier 20-1. For example, if the number of comparators 32-2 is seven as explained above referring to FIG. 2, and capacitor 83 has a capacitance of 0.1 pF, the load of the chopper amplifier 20-1 changes at 0.7 pF as the total.

In order to prevent instabilities which would occur in the chopper amplifier 20-1 due to the load change, a phase compensation circuit 27 is connected to the output 65 of the chopper amplifier 20-1. A capacitor 29 is provided in the phase compensation circuit 27 and has a capacitance substantially equal to the total capacitance of sampling capacitors 82. A switch 28 is controlled to turn on to load the chopper amplifier 20-1 with the capacitor 29 in synchronization at an operation timing of the succeeding converting stage 60-2 at which comparators 32-2 are changed from a sample mode to a comparing mode. Thus, the load of the chopper amplifier can be kept substantially constant to offer a stable operation of the chopper amplifier 20-1 by employing the phase compensation circuit 27 shown in FIG. 8.

While the invention has been particularly shown and described with reference to preferred embodiments the underlying feature of reducing differential non-linearity error by eliminating mismatches between converting stages could be achieved with other means, it will be understood by those skilled in the art that various changes in form and detail may be made without departing froze the spirit and scope of the invention.

What is claimed is:

1. A pipelined analog-to-digital converter comprising:

a plurality of converting stages connected in a cascade form;

wherein each of said converting stages includes an analog-to-digital converter (ADC) unit for converting an analog conversion input into a digital output, said digital outputs from said converting stages forming a conversion output;

wherein each preceding converting stage except a last converting stage further includes amplifier means for deriving and amplifying a conversion residue representing a quantization error resulting from the conversion performed by said preceding converting stage based on said digital output outputted by said ADC unit of said preceding converting stage and said conversion input inputted to said preceding converting stage, said amplified conversion residue from said preceding converting stage being supplied as a input to a succeeding converting stage; and connection means for connecting said amplifier means of said preceding converting stage to a node in said ADC unit of said succeeding converting stage, said node provides a base voltage which is used in said succeeding converting stage;

wherein said ADC unit of said succeeding converting stage includes a chopper amplifier which receives said conversion residue of said preceding converting stage, and a plurality of sampling capacitors which sample the output of said chopper amplifier at the same time, wherein said chopper amplifier includes a phase compensation circuit for changing a compensation factor when said output of said chopper amplifier is sampled.

2. A pipelined analog-to-digital converter comprising:

a plurality of converting stages connected in a cascade form;

wherein each of said converting stages includes an analog-to-digital converter (ADC) unit for converting an analog conversion input into a digital output, said digital outputs from said converting stages forming a conversion output;

wherein each preceding converting stage except a last converting stage further includes amplifier means for deriving and amplifying a conversion residue representing a quantization error resulting from the conversion performed by said preceding converting stage based on said digital output outputted by said ADC unit of said preceding converting stage and said conversion input inputted to said preceding converting stage, said amplified conversion residue from said preceding converting stage being supplied as a input to a succeeding converting stage; and connection means for connecting said amplifier means of said preceding converting stage to a node in said ADC unit of said succeeding converting stage, said node provides a base voltage which is used in said succeeding converting stage;

wherein said amplifying means in a first converting stage has a gain of $2^{N1}/m$ (where m=2, 3, 4, . . . ).

3. A pipelined analog to digital converter comprising:

a plurality of converting stages connected in a cascade form;

wherein each converting stage includes a resistor ladder supplying a plurality of reference levels and an ADC unit for converting an analog conversion input into a digital output by comparing the analog conversion input to said reference levels respectively, digital outputs of ADC units in the converting stages being respectively N1, N2, N3, . . . bits;

each preceding converting stage except a last converting stage further includes amplifier means for deriving and amplifying a conversion residue representing a quantization error resulting from the conversion performed by said preceding converting stage, said amplified conversion residue from said preceding converting stage being supplied to a succeeding converting stage as a conversion input;

wherein said amplifying means in respective converting stages have gains of $2^{N1}/m, 2^{N2}, 2^{N3}, \ldots$, and reference levels in a second and further succeeding converting stages are respectively spread in a range corresponding to 1/m of a full-scale range of a first converting stage (where m=2, 3, 4, . . . );

wherein each of the second and further succeeding converting stages further includes (m−1) sets of additional resistor ladders serially connected to said resistor ladder.

4. A pipelined analog to digital converter according to claim 3, further includes a pair of voltage supply terminals commonly connected to both ends of a resistor ladder in the first converter stage and both ends of serially connected resistor ladders in each of the second and further succeeding converting stages.

5. A pipelined analog to digital converter comprising:

a plurality of converting stages connected in a cascade form;

wherein each converting stage includes a resistor ladder supplying a plurality of reference levels and an ADC unit for converting an analog conversion input into a digital output by comparing the analog conversion input to said reference levels respectively, digital outputs of ADC units in the converting stages being respectively N1, N2, N3, . . . bits;

each preceding converting stage except a last converting stage further includes amplifier means for deriving and amplifying a conversion residue representing a quantization error resulting from the conversion performed by said preceding converting stage, said amplified conversion residue from said preceding converting stage being supplied to a succeeding converting stage as a conversion input;

each of a second and further succeeding converting stages having overlap ranges allocated at upper and lower sides of a full-scale range thereof;

wherein said amplifying means in respective converting stages have gains of $2^{(N1-1)}/m, 2^{N2}, 2^{N3}, \ldots$, and reference levels in a second and further succeeding converting stages are respectively spread in a range corresponding to 1/m of a full-scale range of a first converting stage (where m=2, 3, 4, . . .);

wherein each of the second and further succeeding converting stages further includes (m−1) sets of additional resistor ladders serially connected to said resistor ladder.

6. A pipelined analog to digital converter according to claim 5, further includes a pair of voltage supply terminals commonly connected to both ends of a resistor ladder in the first converter stage and both ends of serially connected resistor ladders in each of the second and further succeeding converting stages.

7. A pipelined analog-to-digital converter comprising:

a first converting stage including a first analog-to-digital converter unit which converts an analog conversion input into a first digital output and a first chopper amplifier which derives and amplifies a first conversion residue representing a first quantization error resulting from a first conversion performed by said first analog-to-digital converter unit wherein said chopper amplifier is formed with a first operational amplifier having an inverting input terminal and a non-inverting input terminal;

a second converting stage including a second analog-to-digital converter unit which converts the amplified first conversion residue obtained in said first chopper amplifier into a second digital output by comparing the output of said first chopper amplifier with a plurality of reference voltages which are supplied respectively from a plurality of nodes of a first resistance ladder formed in said second analog-to-digital converter unit; and a connecting line electrically connecting said noninverting input terminal of said operational amplifier to one of said nodes in said resistance ladder which supplies a reference voltage corresponding to a conversion level at which said second digital output should be zero.

8. A pipelined analog-to-digital converter according to claim 7, wherein said second converting stage further including a second chopper amplifier which derives and amplifies a second conversion residue representing a second quantization error resulting from a second conversion performed by said second analog-to-digital converter unit; and said pipelined analog-to-digital converter further comprising:

a third converting stage including a third analog-to-digital converter unit which converts the amplified second conversion residue obtained in said second chopper amplifier into a third digital output by comparing the output of said second chopper amplifier with a plurality of reference voltages which are supplied respectively from a plurality of nodes of a second resistance ladder formed in said third analog-to-digital converter unit.

9. A pipelined analog-to-digital converter according to claim 8, further comprising:

another connecting line connecting a non-inverting input terminal of another operation amplifier forming said second chopper amplifier to one of said nodes of said second resistance ladder formed in said third analog-to-digital converter unit which supplies a reference voltage corresponding to a conversion level at which said third digital output should be zero.

* * * * *